United States Patent [19]
Ishihara et al.

[11] Patent Number: 5,347,279
[45] Date of Patent: Sep. 13, 1994

[54] ANALOG/DIGITAL CONVERTER OF THE OVER-SAMPLING TYPE WITH FEEDBACK CORRECTION TO OFFSET SAMPLING ERROR

[75] Inventors: Yukihito Ishihara; Kazuo Yamakido; Yuko Tamba, all of Tokyo, Japan

[73] Assignee: Hitachi, Ltd., Tokyo, Japan

[21] Appl. No.: 939,594

[22] Filed: Sep. 2, 1992

[30] Foreign Application Priority Data

Sep. 2, 1991 [JP] Japan .................................. 3-248277

[51] Int. Cl.$^5$ ............................................. H03M 1/50
[52] U.S. Cl. ..................................... 341/166; 341/143
[58] Field of Search ............... 341/166, 143, 167, 168, 341/169, 170; 375/25, 26, 28, 27, 33

[56] References Cited

U.S. PATENT DOCUMENTS

| | | | |
|---|---|---|---|
| 5,079,550 | 1/1992 | Sooch et al. | 341/143 |
| 5,103,228 | 4/1992 | Voorman et al. | 341/143 |
| 5,227,795 | 5/1991 | Yamakido et al. | 341/166 |

OTHER PUBLICATIONS

M. W. Hauser et al., "Data Converters", Feb. 1985, ISSCC 85, pp. 80–81.
K. Yamakido et al., "Voiceband Telecommunications", ISSCC 86, Feb. 1986, pp. 180–181.
R. Koch et al., "12-bit Sigma–Delta A/D Converter with 15 Mhz Clock Rate", Dec. 1986, IEEE-JSSC, pp. 1003–1009.

*Primary Examiner*—Brian K. Young
*Attorney, Agent, or Firm*—Antonelli, Terry, Stout & Kraus

[57] ABSTRACT

The difference between the output current of a voltage-current converter circuit and the output current of a local D/A converter circuit 2, whose output current is controlled by a feedback signal, is integrated by an analog circuit of which one end is connected to a DC potential point, and the voltage obtained by the integration thereof is quantized by a quantizing circuit. The result is integrated by a digital integrating circuit and is fed to a feedback correcting circuit 6 and, further, the result of A/D conversion is output. The feedback correcting circuit outputs a temporary feedback signal while the digital integration is being operated based on the output of the quantizing circuit. After the digital integrating operation completes the digital integration operation, a corrected feedback signal is generated instead of the temporary feedback signal. The signals inputted into the analog circuit 3 are continuously sampled even while the digital integration operation is being carried out.

14 Claims, 13 Drawing Sheets ic, whereby error develops in the integrated current and S/N characteristics are noticeably deteriorated. Here, there is a contrivance of controlling the gate of the MOSFET constituting the sampling switch with a boosted voltage. In this case, however, not only the above MOSFET but also the MOSFET in the boosting circuit must have a high breakdown voltage structure, resulting in a complex process for fabricating the semiconductor integrated circuit and an increase in the chip area.

ANALOG/DIGITAL CONVERTER OF THE OVER-SAMPLING TYPE WITH FEEDBACK CORRECTION TO OFFSET SAMPLING ERROR

BACKGROUND OF THE INVENTION

The present invention relates to an analog-to-digital (hereinafter often simply referred to as A/D) converter that converts an analog voltage signal into a corresponding digital signal and, more specifically, to an A/D converter of the over-sampling type that is suited for being realized in the form of a semiconductor integrated circuit.

As an example of the A/D converters there is an over-sampling type which uses sampling frequencies which are several tens to several hundreds of times as high as the frequency band of the analog input signals. The A/D converters of the over-sampling type can be classified into several types depending upon their circuit constitutions, such as those of the delta-sigma ($\Delta\Sigma$) type disclosed in a first literature ISSCC '85, Digest of Technical Papers, pp. 80–81 (February 1985) and those of the interpolation type disclosed in a second literature ISSCC '86, Digest of Technical Papers, pp. 180–181 (February 1986).

A system which converts an input analog voltage signal into a current signal by using a voltage-current current converting circuit has been taught in a third literature IEEE Journal of Solid-State Circuits, SC-21 (December 1986) pp. 1003–1010.

SUMMARY OF THE INVENTION

The present inventors have studied an A/D converter of the over-sampling type shown in FIG. 12. In the A/D converter of FIG. 12, a voltage-current converting circuit 11 proportionally converts an analog input voltage signal Vin into a current signal Iin. A current output-type local D/A converting circuit 12 outputs a current signal Iq that corresponds to the output value of a digital integrating circuit 15. A differential current Id ($=$Iin$-$Iq) between them flows into an analog integrating circuit 13 through a sampling switch 17 and is integrated for only a period of time in which the sampling switch 17 is closed. A voltage Vc of the integrating circuit is converted into a digital signal of one bit or a plurality of bits through a quantizing circuit 14 which has a voltage comparing circuit. The digital signal is output through a digital integrating circuit 15 thereby to obtain the result of A/D conversion. The differential current Id is integrated by the analog integrating circuit 13 while the sampling switch 17 is closed, and the period in which the sampling switch 17 remains open is used as the period for operating the digital integration of the integration voltage. This is shown in FIG. 13 in which $t_{int}$ denotes a sampling period and $t_{cal}$ denotes an operation time. Therefore, the result of voltage comparison effected by the quantizing circuit 14 is reflected on the output of the local D/A converting circuit 12 from the beginning of sampling period in the next operation cycle.

The sampling switch 17 can be constituted by a switch gate such as a CMOS transfer gate. However, the drain voltage or the source voltage of the MOSFET seldom makes a full swing with respect to the power source voltage. When the gate is controlled with a power source voltage, therefore, the ON-state resistance of the transfer gate increases and the switching characteristics are far from ideal switching characteris- In order to omit the sampling switch, therefore, the present inventors have conducted simulations using a computer and, as a result of their investigative efforts, they have found that the S/N characteristic is deteriorated when the 100% integration is effected using the constitution of FIG. 12, i.e., when the sampling switch 7 is maintained closed. The cause will be described below. Referring to FIG. 13, when the sampling is effected using the sampling switch 17, the integration is carried out during the first half period $t_{int}$ of the sampling period, the digital integration is carried out during the second half period $t_{cal}$, and the result of voltage comparison is reflected on the local D/A converting circuit 12 from the beginning of the next sampling period. On the other hand, when the analog integration is effected by 100% as shown in FIG. 14, the whole operation cycle becomes the integration period $tin_t$, and the period $t_{cal}$ for operating the digital integration is shifted into the next cycle. In the case of 100% integration, therefore, the result of voltage comparison is reflected on the local D/A converting circuit 12 starting from the middle of the next sampling period. It has been found that this amount of delay becomes an error in the analog integration which deteriorates the S/N characteristic.

The object of the present invention, therefore, is to provide an A/D converter of the current drive type which does not use a sampling switch so that the characteristics are not deteriorated by the switching noise.

Another object of the present invention is to provide an A/D converter of the voltage-sampling type which consumes a small amount of electric power under a wide range of power source voltage conditions inclusive of low power source voltage operation, and is capable of realizing a stable conversion characteristic irrespective of variation in the values concerning the fabrication of the elements.

A further object of the present invention is to provide an A/D converter of the over-sampling type whose conversion characteristic hardly deteriorates because of digital noise from the logic circuit when the A/D is converter is fabricated on a chip together with a large-scale logic circuit in the form of a one-chip analog/digital mixed large-scale semiconductor integrated circuit.

A still further object of the present invention is to provide an A/D converter of the over-sampling type that is capable of accomplishing higher conversion accuracy by over-sampling by the use of a sampling period shorter than a conventional one and employing a wider band of conversion signals without impairing the above-mentioned object.

The above and other objects as well as novel features of the present invention will become obvious from the description of the specification and the accompanying drawings.

Means for Solving the Problems

Representative aspects one of the invention disclosed in this application will now be described briefly.

That is, the difference between the output current of a voltage-current converter circuit that converts an input voltage signal into a current signal in accordance with the voltage amplitude thereof and the output of a local D/A converter circuit, whose output current is controlled by a digital signal, is integrated by an analog circuit of which one end is connected to a DC potential point; the voltage obtained by the integration thereof is compared with a predetermined threshold potential through a quantizing circuit; and a digital circuit forms the digital signal based on the result of comparison thereof and outputs the result of A/D conversion. Here, the digital circuit has a feedback correcting means which corrects the digital signal to offset the error in the analog quantity sampled by the analog circuit before the output of the quantizing circuit is reflected on the output of the local D/A converting circuit.

When the digital circuit includes a digital integrating circuit that integrates the output of the quantizing circuit and outputs the result to the feedback correcting means, then this feedback correcting means is constituted as a circuit which equalizes the average value of the output during one sampling period to the output of the digital integrating circuit on which is reflected the output of the quantizing circuit during this period.

To constitute the analog/digital converter of the interpolation type, the analog circuit includes a capacitance element that is coupled to a DC potential point. There is further included a resistance element which is coupled between the capacitance element and the current output connection point.

The local D/A converting circuit can be so constituted that the output current is controlled by a digital signal consisting of a plurality of bits.

When the sampling period and operation cycles are 100% sampling periods, the processing such as the operation of digital integration is carried out in the next cycle. The error in the feedback current, before the result of the processing is reflected on the output of the local D/A converter, i.e., the feedback current signal, is offset by correcting the digital data by such a technique as averaging method, when the 100% sampling period is adopted without using a sampling switch. Therefore, the feedback correcting means operates so that an error is not generated in the feedback current signals. Thus, an sampling switch is not employed in the A/D converter of the current driving type, and the characteristics are prevented from being deteriorated by the switching noises.

In the A/D converter of the current drive type, employment of a multi-bit current switching circuit for the local D/A converting circuit decreases a differential current between the input signal current and the feedback current signal. This makes it possible to stabilize the operation of the constant-current source MOS transistor that constitutes the input voltage/current converter circuit and the local D/A converter circuit and, hence, to operate the A/D converter on a reduced power source voltage and to decrease the consumption of electric power.

Moreover, the multi-bit current switching circuit which is used as the local D/A converting circuit decreases the quantizing noise power which, then, enables the sampling frequency to be further lowered for obtaining a desired conversion accuracy, contributing to lowering the operation speed of the circuit. This means that the consumption of electric power can be further reduced. At the same time, the precision of elements such as capacitors, power source transistors, etc. can be greatly relaxed.

Moreover, the analog integration circuit constituted by a passive element coupled to a DC potential point is not of a virtually grounded type that in principle is most apt to receive digital noise from the logic circuit but is of a grounded type which makes it possible to realize an A/D converter that stably operates irrespective of variation in the power source voltage or digital noise.

Reference is made herein to a related, commonly assigned, copending U.S. application, Ser. No. 07/704,599 filed May 23, 1991, and now U.S. Pat. No. 5,227,795, the subject matter of which is incorporated herein by reference.

DESCRIPTION OF THE PREFERRED EMBODIMENTS

Figure 1:
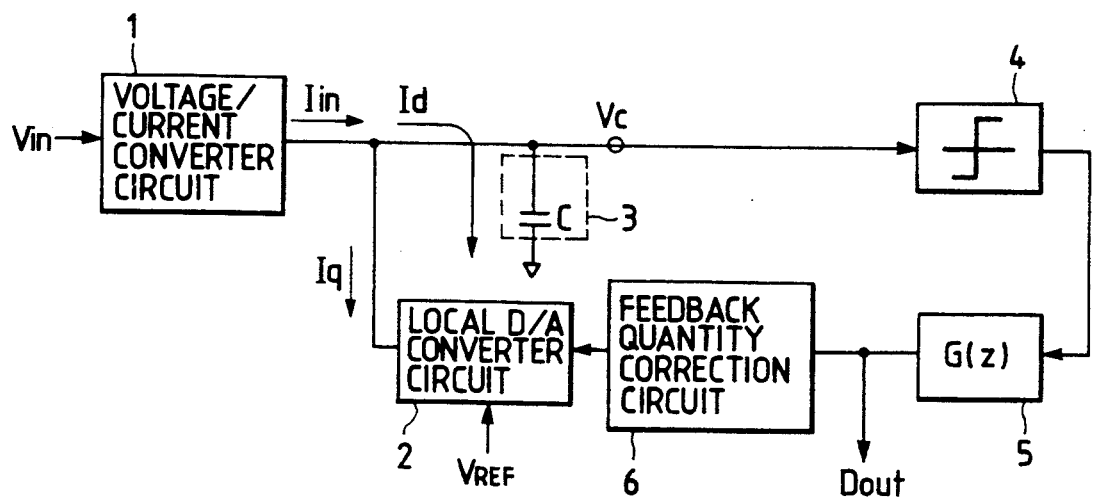
FIG. 1 is a diagram illustrating the fundametal constitution of an over-sampling type A/D converter of an embodiment of the present invention.
Figure 12:
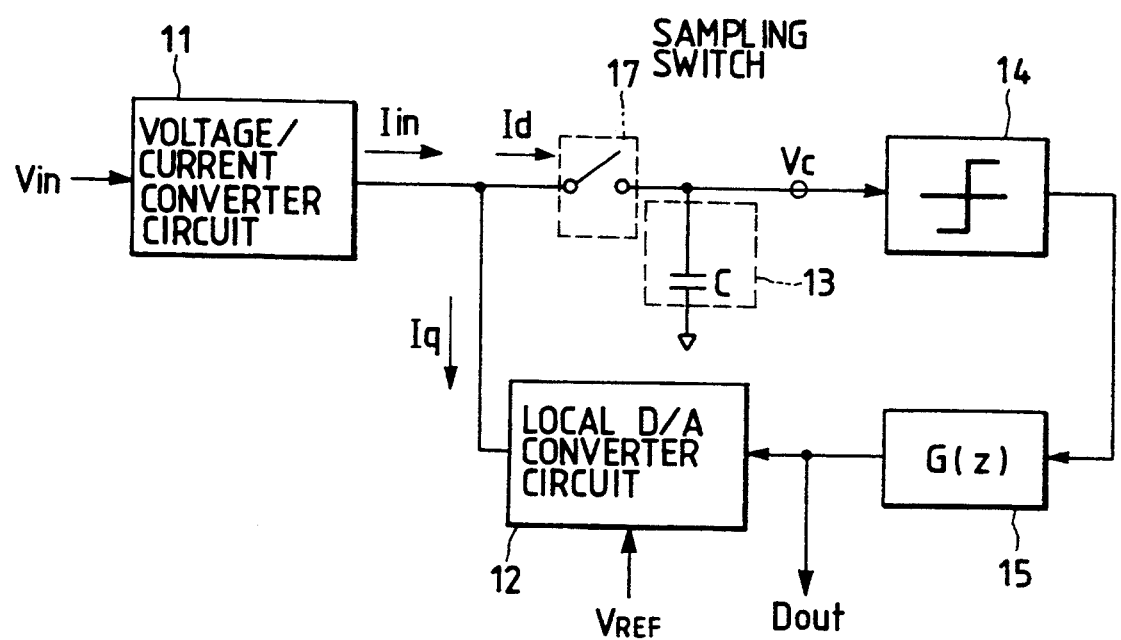
FIG. 12 is a block diagram illustrating the principle of the over-sampling type A/D converter having a sampling switch studied by the present inventors.

FIG. 1 illustrates the fundamental constitution of an over-sampling type A/D converter of an embodiment according to the present invention. The constitution of FIG. 1 is different from the constitution of FIG. 12 in that the current sampling switch 17 is removed but, instead, a feedback correcting circuit 6 is added. A voltage-current converting circuit 1 converts an analog input voltage signal Vin into a current signal Iin that corresponds to the voltage amplitude thereof. The output current of a local D/A converting circuit 2 of the current output type is controlled by a digital signal, and the outputted current signal Iq corresponds to the digital value outputted from, for example, the feedback correcting circuit 6. A differential current Id (=Iin−Iq) between them is fed to an analog integrating circuit 3 of which a capacitance element C is typically diagrammed, and is integrated. The voltage Vc of the analog integrating circuit 3 is converted into a digital signal of, for example, one bit through a quantizing circuit 4 which has a voltage comparing circuit. The digital signal is integrated through a digital integrating circuit 5, and the result of integration is output as an A/D conversion result. The feedback correcting circuit 6 corrects the local D/A converter circuit 2 so as to offset the error in the analog quantity sampled by the analog integrating circuit 3 until the output of the quantizing circuit is reflected on the output of the local D/A converting circuit 2. For instance, the feedback correcting circuit 6 is so constituted to output a digital value for equalizing the average value of the output during one sampling period to the output of the digital integrating circuit 5 on which is reflected the output of the quantizing circuit 4 during this period.

Figure 2:
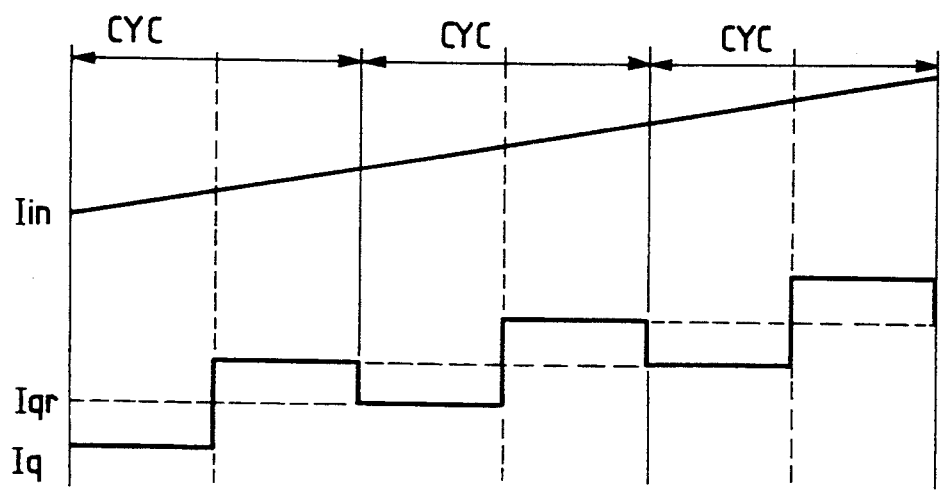
FIG. 2 is a timing chart for explaining the principle of operation of the A/D converter of FIG. 1.
Figure 13:
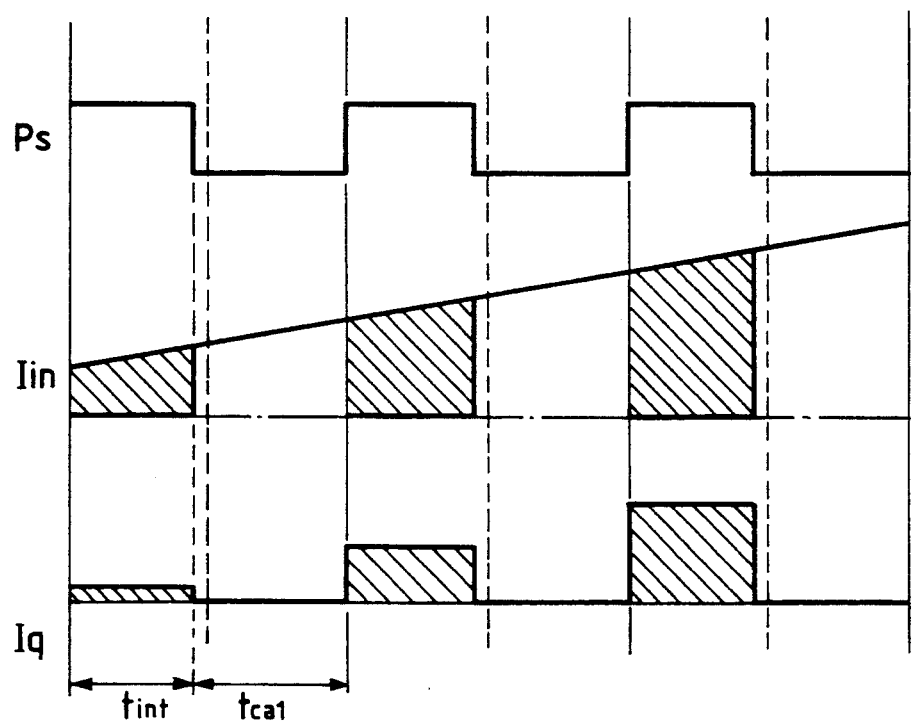
FIG. 13 is an operation timing chart showing chiefly the relationship between the sampling operation of the A/D converter shown in FIG. 12 and the digital integration operation.
Figure 14:
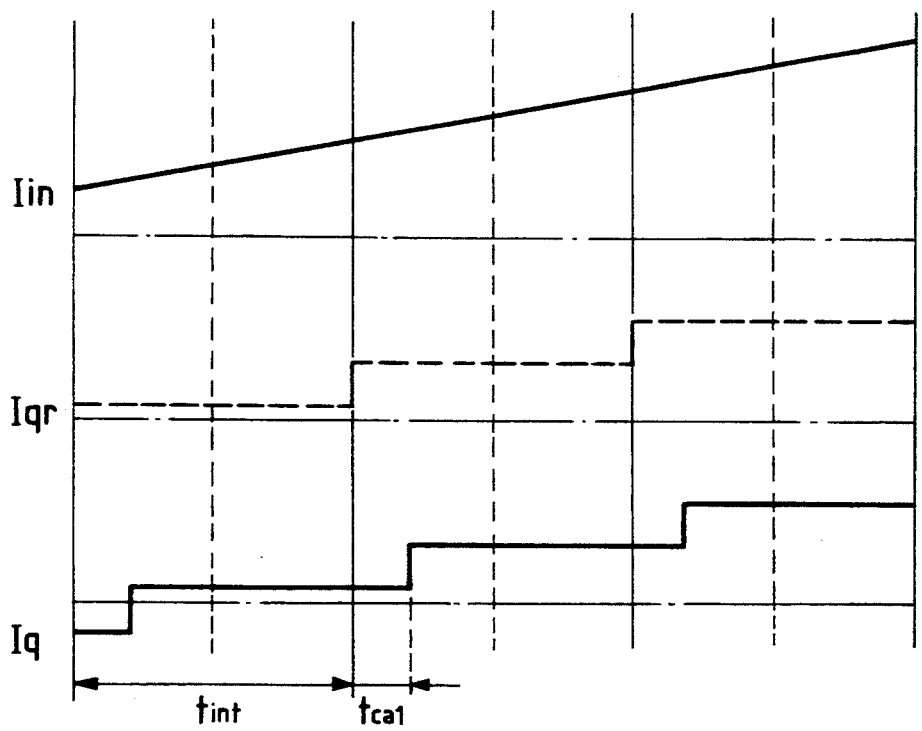
FIG. 14 is an operation timing chart of when the sampling switch is normally closed in the A/D converter of FIG. 12.

FIG. 2 is a timing chart for explaining the principle of operation of the A/D converter of FIG. 1. In FIG. 2, symbol CYC denotes one sampling period or one operation cycle of A/D conversion which, though there is no particular limitation, is brought into agreement with an interval period of comparison operation of the quantizing circuit 4. Since there exists no sampling switch 17 in the constitution of FIG. 1, the whole period of the cycle CYC becomes the sampling period, i.e., the integration period of the analog integration circuit 3. When the time for operating the digital integration is $t_{cal}=0$ in FIG. 13, then the ideal change in the feedback current Iq is expressed by the waveform of ideal feedback current signals Iqr indicated by a broken line in FIG. 2. In practice, however, the operation time of digital integration cannot be brought to zero. In this case as shown in FIG. 2, the feedback correcting circuit 6 first controls the feedback current Iq according to the value obtained in the preceding operation cycle and then controls the feedback current Iq at a predetermined timing during the operation cycle so that the average value of the feedback current Iq in this cycle is brought into agreement with the current value of the ideal feedback current signal Iqr. Owing to the operation of the feedback correcting circuit 6, therefore, the analog integration is carried out without developing error indicated by Iq in FIG. 14 even when the 100% analog integration is carried out in each operation cycle.

Figure 3:
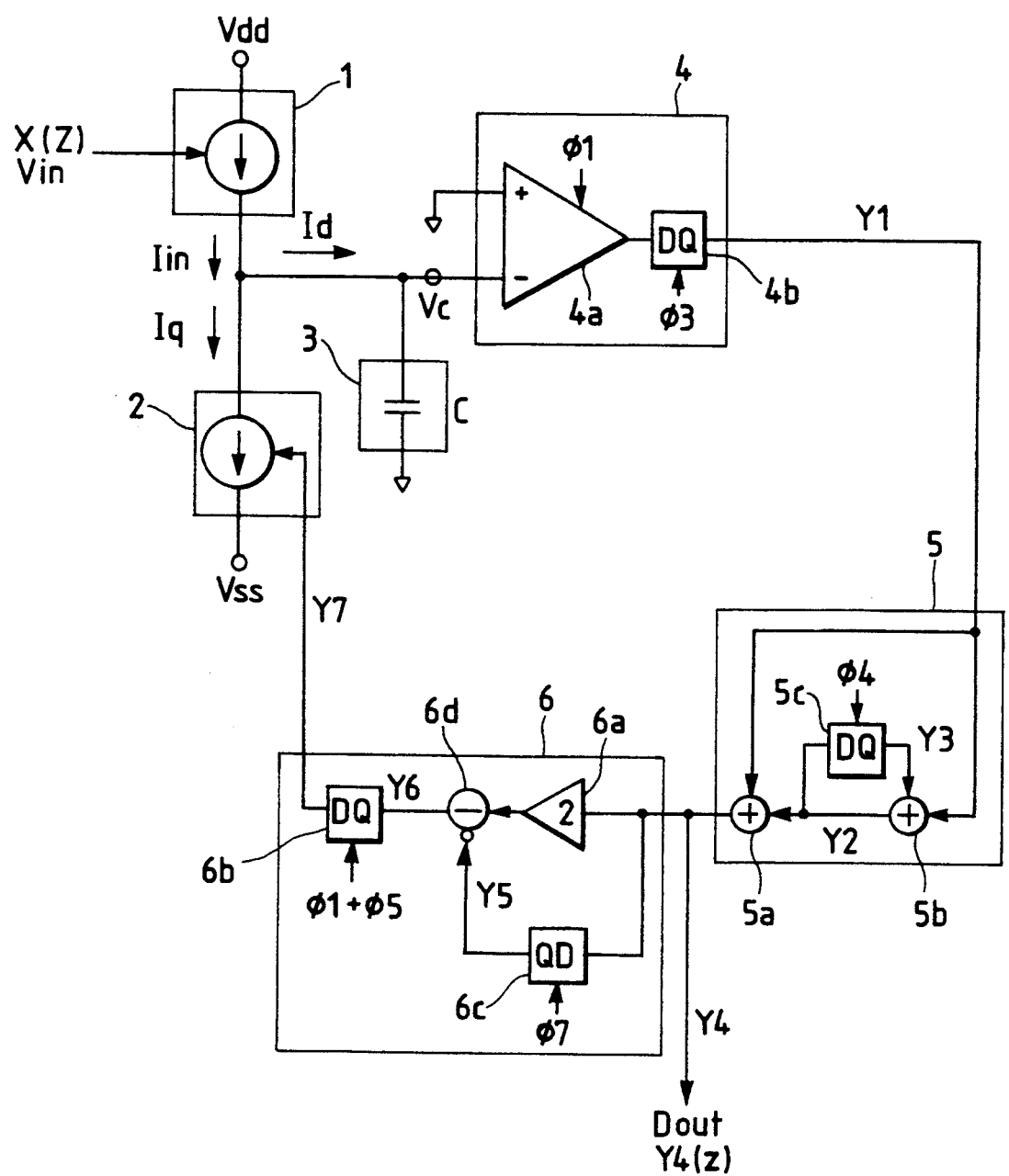
FIG. 3 is a block diagram illustrating in detail the embodiment of the interpolation type over-sampling A/D converter constituted in compliance with the principle of FIG. 1.
Figure 4:
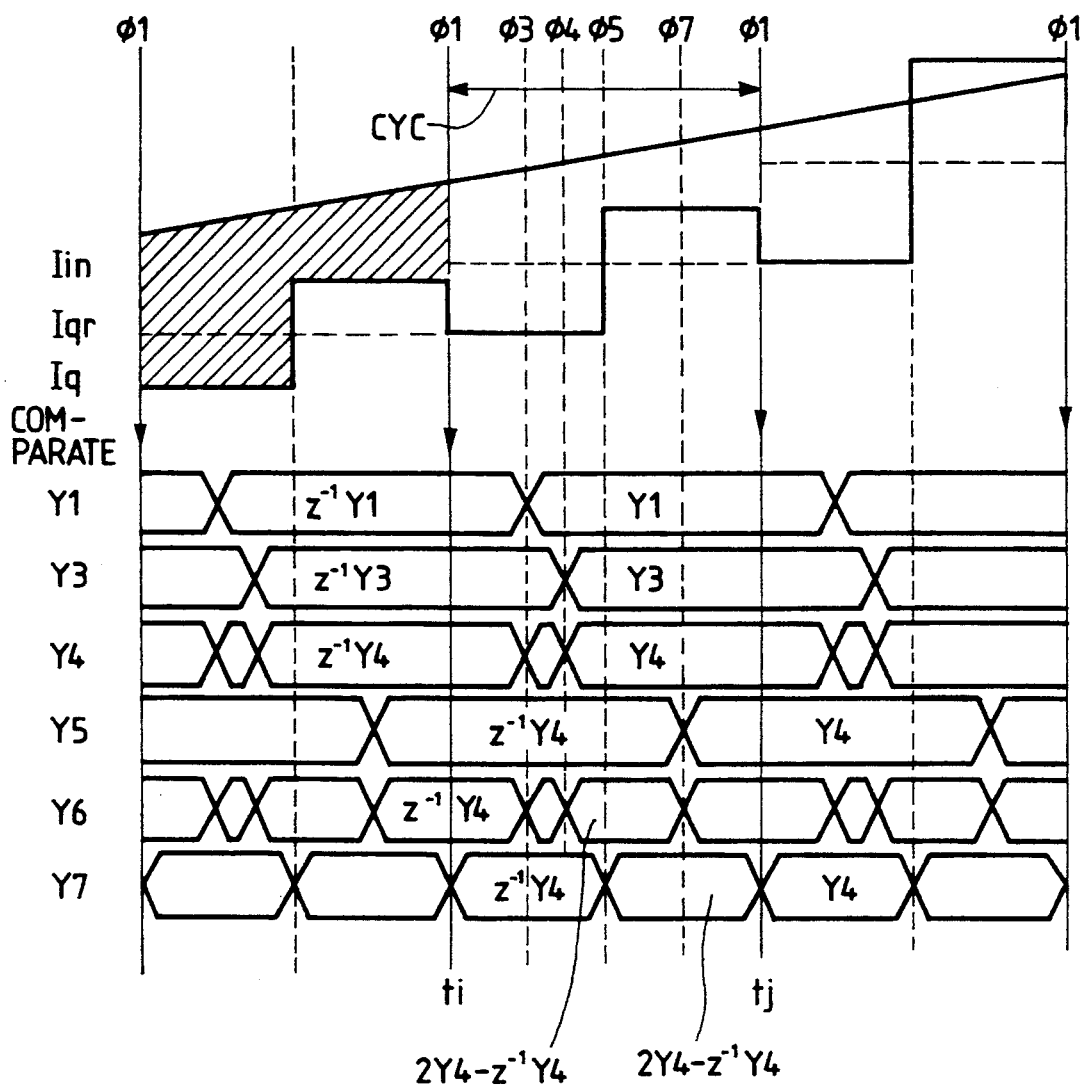
FIG. 4 is a timing chart for explaining the operation of the A/D converter of FIG. 3.

FIG. 3 illustrates in detail an embodiment of the interpolation type over-sampling A/D converter constituted in compliance with the principle of FIG. 1. FIG. 4 is a timing chart for explaining the operation of the A/D converter of FIG. 3. In this embodiment, the feedback correcting circuit 6 outputs the average value of a preceding sampling period in the first half of the sampling period CYC and outputs the corrected value in the second half of the sampling period. In FIG. 3, reference numeral 6a denotes a doubling circuit, 6b and 6c denote latch circuits, 6d denotes a substracting circuit, 5a and 5b denote adder circuits, 5c denotes a latch circuit, 4a denotes a comparator circuit, and reference numeral 4b denotes a latch circuit.

In FIG. 3, the integration voltage Vc by the differential current Id can be expressed as given below by using a z-function. Here, a signal such as Y1 is expressed as Y1 (z) in the z-function notation and the input voltage signal Vin is expressed as V (z).

$$(1-z^{-1})Vc(z)=1/C\int[Iin-Iq]dt \quad (1)$$

When, Iin=X(z)/R, the equation (1) is transformed into $$(1-z^{-1})Vc(z)=1/(R \cdot C \cdot fs) \cdot [X(z)-(Y7(z)+z^{\frac{1}{2}}Y7(z))/2]$$

where Y7(z) is $$Y7(z)=2Y4(z)-Z^{-1}Y4(z) \quad (A)$$

and $z^{-\frac{1}{2}}Y7(z)$ is $$z^{-\frac{1}{2}}Y7(z)=z^{-1}Y4(z)$$

Since the number of quantization bits is 1, the equation (1) can be rewritten as $$(1-z^{-1})Vc(z)=[X(z)-\{(2Y4(z)-z^{-1}Y4(z))+z^{-1}Y4(z)\}/2] \quad (2)$$

On the other hand, Y4(z) is $$Y4(z)=[1+1/(1-z^{-1})] \cdot [Vc(z)+N(z)] \quad (3)$$

From the equations (2) and (3), therefore, $$Y4(z)=(2-z^{-1})/[(1-z^{-1})^2+(2-z^{-1})] \cdot [X(z)+(1-z^{-1})N(z)] \quad (4)$$

Accordingly, $$Y4(z) \approx X(z)+(1-z^{-1})N(z) \quad (5)$$

It is thus obvious that the interpolation type A/D converter can be realized by using the circuit of FIG. 3.

The logical constitution of the feedback correcting circuit 6 shown in FIG. 3 is determined in accordance with $$Y7(z)=2Y4(z)-z^{-1}Y4(z)$$

of the above equation (A). The operation of the feedback correcting circuit 6 will now be described with reference to FIG. 4.

If attention is given, for example, to a cycle CYC from a moment ti to a moment tj in FIG. 4, the latch circuit 6c at the moment ti is holding the output $z^{-1}Y4$ that is obtained by the digital integrator 5 at the preceding cycle and the output Y4 is maintained at $z^{-1}Y4$. Therefore, when a control signal $\phi 1$ is asserted at the moment ti, the latch circuit 6b latches $2 \cdot z^{-1}Y4-z^{-1}Y4=z^{-1}Y4$ which is then output as a signal Y7 to the local D/A converter 2. Therefore, the output Y7 of the feedback correction circuit 6 becomes an average value of the preceding sampling period at the beginning of the sampling period CYC. After the control signal $\phi 4$ is asserted, the output Y1 compared in the above cycle CYC by the quantizing circuit 4 is reflected on the digital integrating output Y4. In synchronism therewith, the signal Y6 is $2Y4-z^{-1}Y4$ which is then reflected on the control signal Y7 of feedback current in synchronism with a change in the control signal φ5. As described above, the feedback correcting circuit 6 outputs the average value of the preceding sampling period during the first half of one operation cycle CYC and outputs the corrected value in the second half of one operation cycle CYC. The average value of the signal Y7 output during the period of one operation cycle is equalized to the digital signal Y4 on which is reflected the result Y1 of quantization comparison in the above cycle. Therefore, as representatively shown in FIG. 4, the area (differential current to be analog-integrated) of the region sandwiched by the waveform of the input signal Iin and the waveform of the actual feedback current signal Iq becomes equal to the area (value of ideal differential current) of the region sandwiched by the waveform of the input signal Iin and the waveform of the ideal feedback current signal Iqr. It is therefore allowed to carry out the 100% analog integration in each operation cycle without developing error that deteriorates the S/N characteristic.

Figure 5:
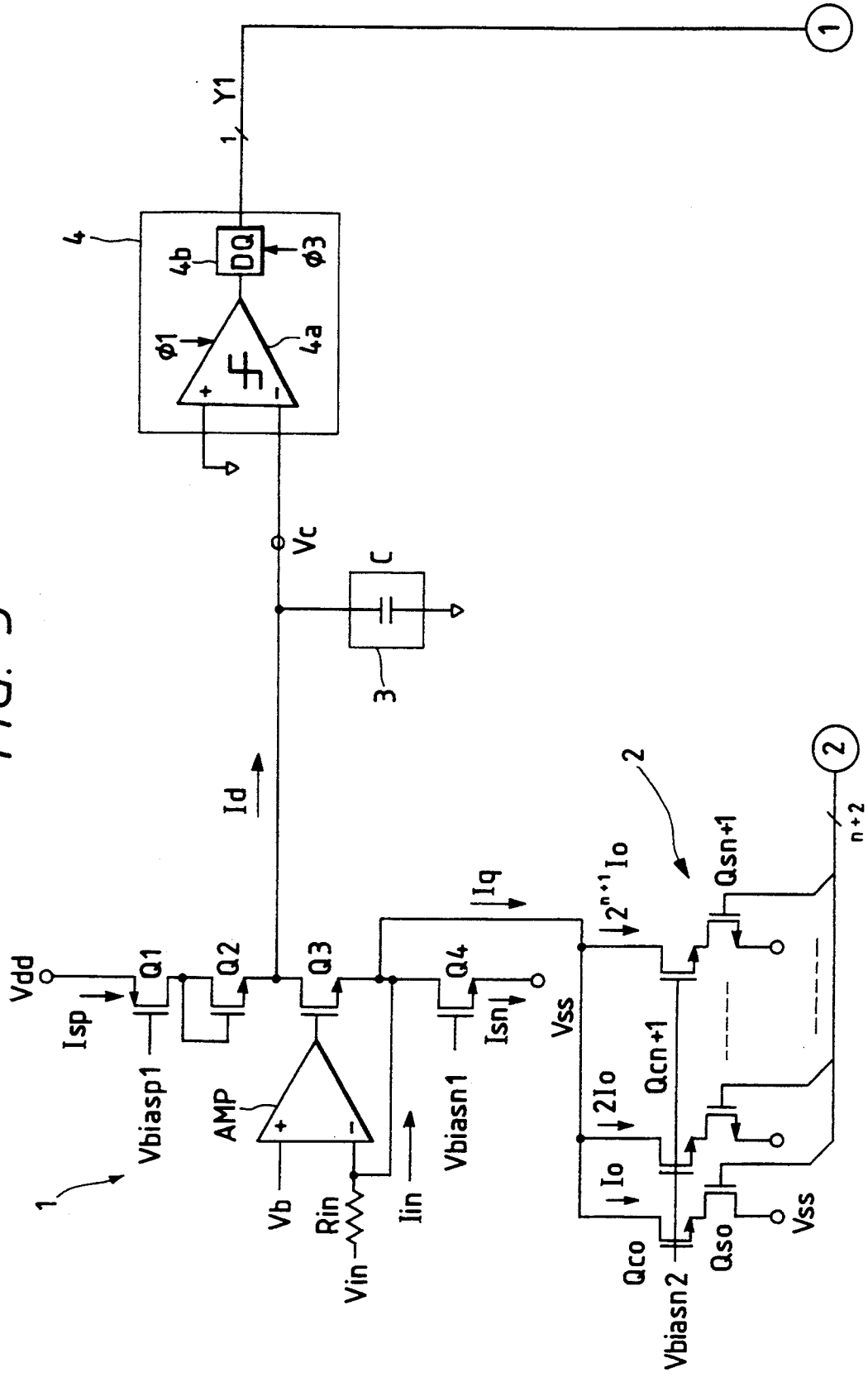
FIG. 5 is a circuit diagram which shows the constitution of FIG. 3 in further detail together with FIG. 6.
Figure 6:
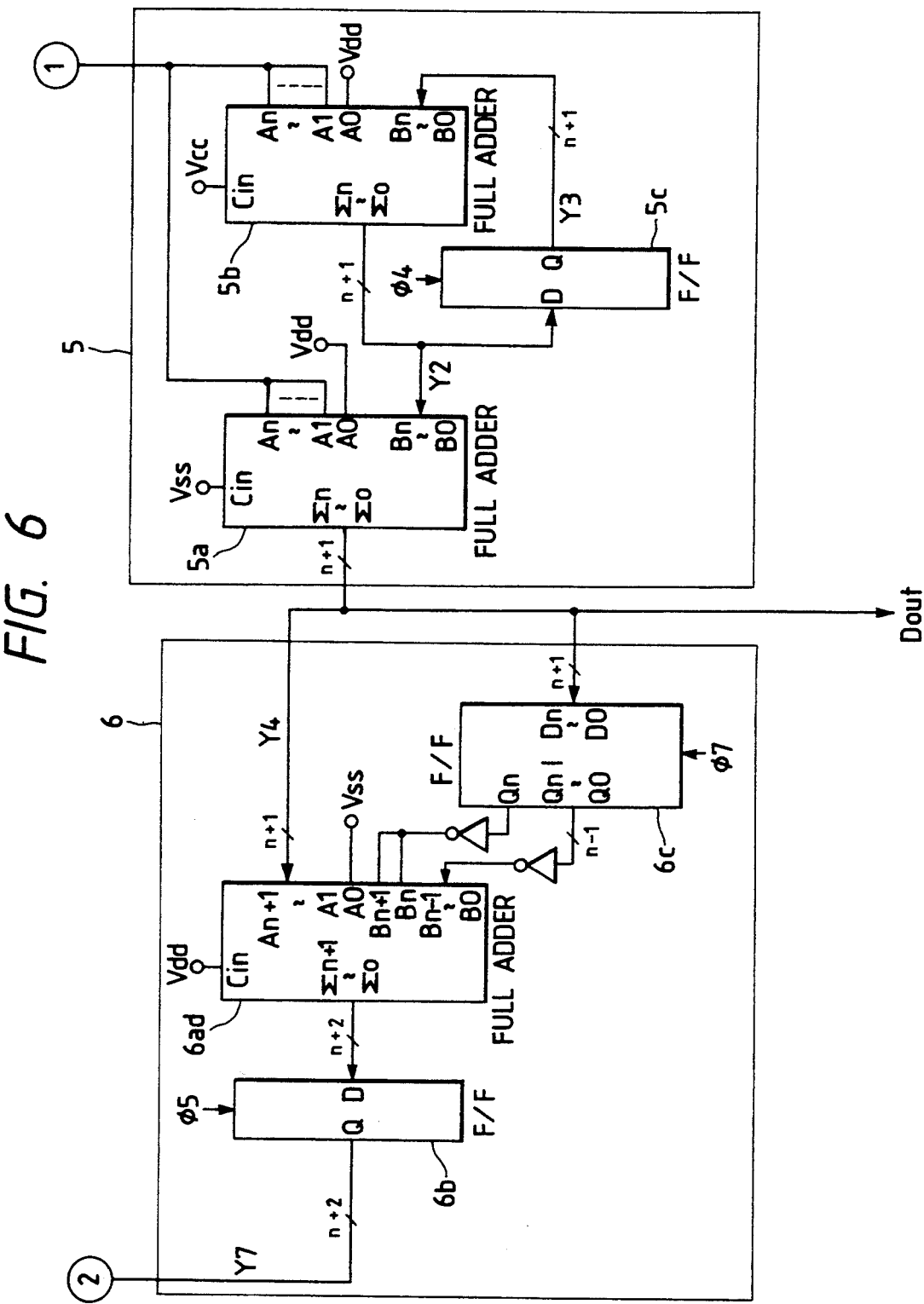
FIG. 6 is a circuit diagram showing the constitution of FIG. 3 in further detail together with FIG. 5.

FIGS. 5 and 6 are circuit diagrams illustrating the constitution of FIG. 3 in further detail. The circuits shown in FIGS. 5 and 6 are connected to each other at corresponding portions designated by ①and ②.

As shown in FIG. 5, the voltage-current converting circuit 1 is constituted by an operational amplifier circuit AMP, a p-channel MOSFET Q1, and n-channel MOSFETs Q2, Q3 and Q4. Though there is no particular limitation, the input voltage signal Vin is obtained by superposing an analog signal component on a DC bias voltage (e.g., analog ground potential) which is internally generated to carry out the operation by a single power source. The input signal Vin is fed to an inverting input terminal (−terminal) of the operational amplifier AMP via a resistance element Rin. Though there is no particular limitation, the non-inverting input terminal (+terminal) of the operational amplifier AMP is served with a voltage lower than the DC bias voltage such as a voltage Vb which is roughly half the DC bias voltage. To the output of the operational amplifier AMP is connected the gate electrode of a MOSFET Q3 of which the source electrode is connected to the inverting input terminal of the amplifier AMP. On the drain side of the MOSFET Q3, a current source connected to the power source Vdd is constituted by the MOSFET Q1 whose gate is biased by a voltage Vbiasp1 and the MOSFET Q2 which is diode-connected. On the source side of the MOSFET Q3, a current source is constituted by the MOSFET Q4 which is connected to a ground potential Vss and of which the gate is biased by a voltage Vbiasp1. A path of feedback current Iq of the local D/A converter 2 and a path of current signal Iin are connected to a node where the MOSFET Q3 and Q4 are coupled together, and the analog integrating circuit 3 is connected to a node where the MOSFETs Q2 and Q3 are coupled together. Here, among the input current Iin, feedback current Iq and differential current Id, a relationship is established in which Iin−Iq=Id+Isn−Isp, where Isp and Isn are constant currents.

In the voltage-current converter circuit 1, the input level at the non-inverting input terminal of the operational amplifier AMP is set to a potential Vb which is lower than the analog ground potential or which is, for example, a half thereof, so that the source potential of the MOSFET Q3 becomes lower than the analog ground potential. It is therefore allowed to bias the drain electrode of the MOSFET Q3 to a voltage close to the analog ground potential, and hence to maximize or nearly maximize the operation sensitivity of the comparator 4a that works based on the analog ground potential as a reference. If the input level at the non-inverting input terminal of the operation amplifier AMP is set to be equal to the analog ground potential, the source potential of the MOSFET Q3 becomes the analog ground potential, and the level at the drain electrode becomes higher than the analog ground potential when the MOSFET Q3 is turned on, causing the sensitivity of the comparator 4a to lower in the comparing operation. Nevertheless, it is not easy to set the reference of the comparing operation of the comparator 4a to a value other than the analog ground potential, and a special circuit is required in such a case.

Moreover, the level-shifting function of the voltage-current converter circuit 1 works to reduce the DC component of the input analog signal which is formed by using the internally generated DC voltage as a DC bias voltage, i.e., works to reduce a change in the voltage across electrodes of a capacitor caused by the current integration. This stabilizes the operation of the constant-current source MOS transistors that constitute the input voltage-current converter circuit and the local D/A converter circuit, and accordingly contributes to lowering the power source voltage for driving the A/D converter and to reducing the consumption of electric power.

According to FIG. 5, the local D/A converter circuit 2 is constituted by n-channel MOSFETs Qc0 to Qcn+1, in which constant currents IO, 2IO, ... , $2^{n+1}$IO flow when the gate electrodes thereof are biased by a voltage Vbiasn2, and n-channel MOSFETs Qs0 to Qsn+1 that are arranged between ground potential Vss and the drain electrodes of the MOSFETs Qc0 to Qcn+1. The drain electrodes of the MOSFETs Qc0 to Qcn+1 are commonly connected to the source electrode of the MOSFET Q3. Upon receiving a control signal Y7 of n+2 bits outputted from the feedback correcting circuit 6 through the gate electrodes thereof, the MOSFETs Qs0 to Qsn+1 are controlled for the switching and permit binary load constant currents to flow depending upon the digital value of the signal Y7.

According to FIG. 6, the adder circuits 5a and 5b in the digital integration circuit 5 are constituted by full adder circuits of n+1 bits, and the latch circuit 5c is constituted in the parallel-in/parallel-out form of n+1 bits.

According to FIG. 6, the feedback correcting circuit 6 is constituted by a latch circuit 6c of the parallel-in/parallel-out form of n+1 bits, a full adder circuit 6ad of n+2 bits, and a latch circuit 6b of the parallel-in/parallel-out form of n+2 bits. The full adder circuit 6ad realizes the functions of the subtracting circuit 6d and the doubling circuit 6a of FIG. 3. That is, the signal Y4 of n+1 bits is upwardly shifted by one bit and is inputted to the full adder circuit 6ad thereby to realize the function of the doubling circuit. Moreover, the output of the latch circuit 6c is logically inverted through an inverter and is input to the full adder circuit 6a in order to realize the function of the subtracting circuit.

Figure 7:
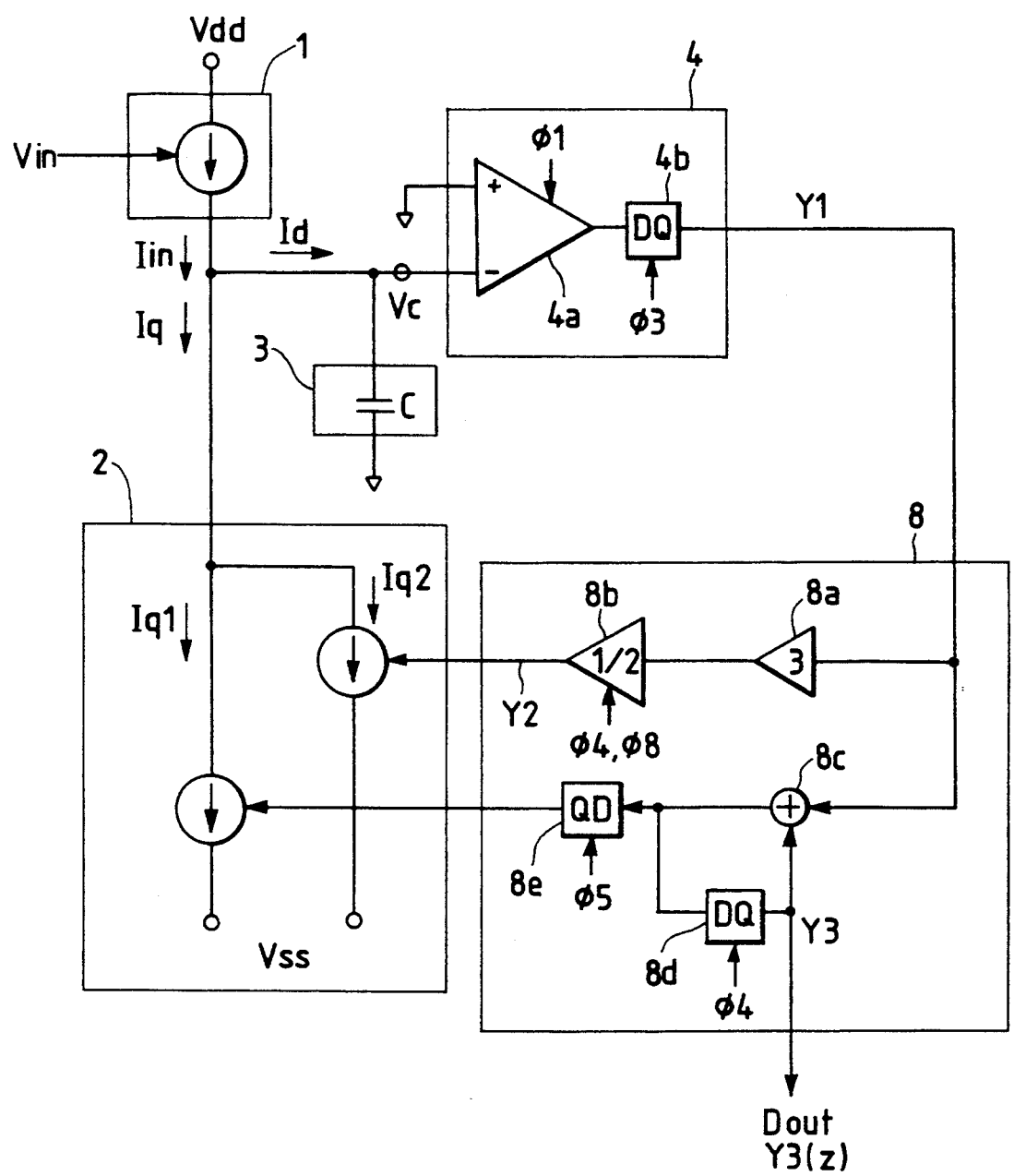
FIG. 7 is a block diagram of the interpolation type over-sampling A/D converter of another embodiment according to the present invention.
Figure 8:
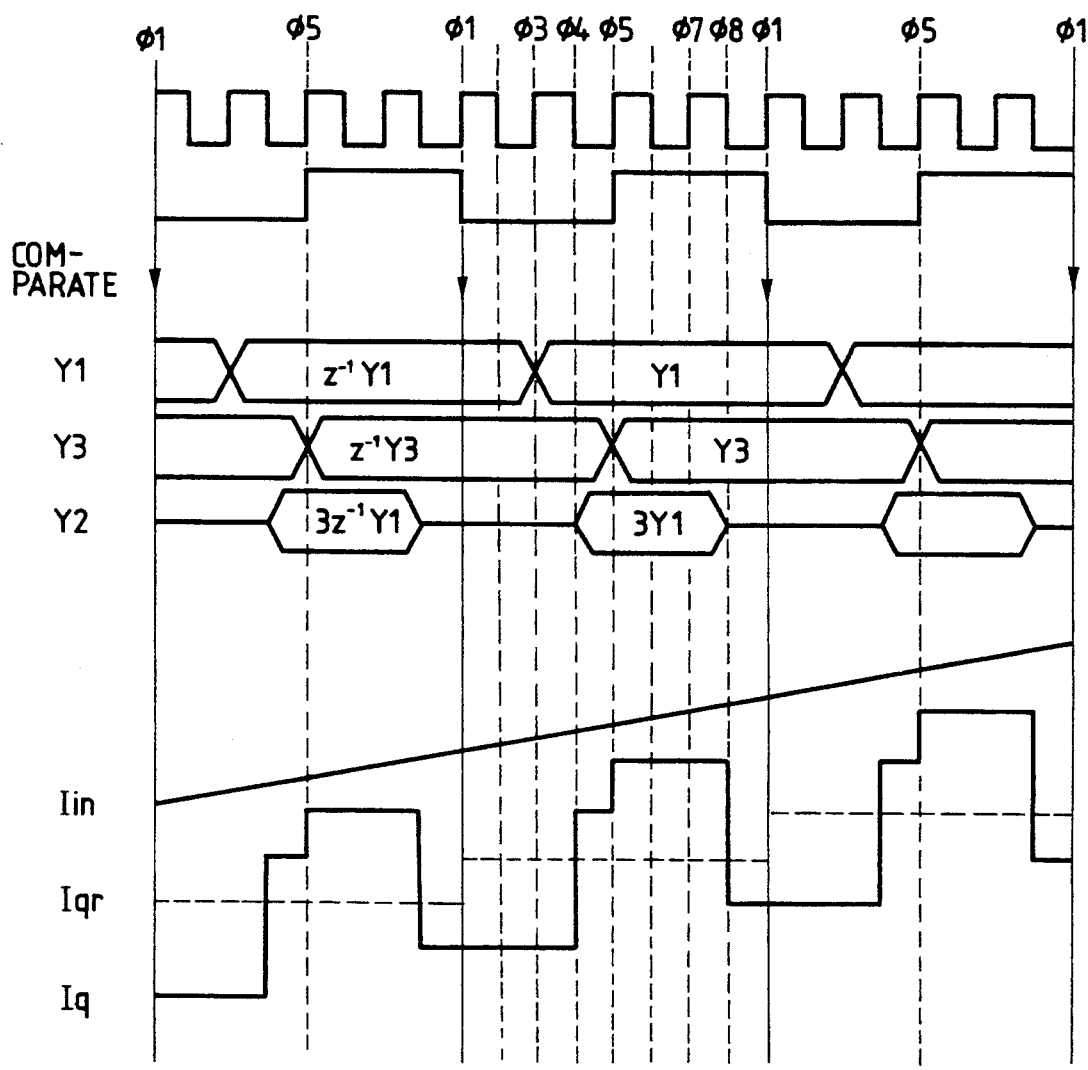
FIG. 8 is a timing chart for explaining the operation of the A/D converter of FIG. 7.

FIG. 7 illustrates an interpolation-type over-sampling A/D converter of another embodiment according to the present invention. FIG. 8 is a timing chart for illustrating the operation of the A/D converter of FIG. 7. Instead of the digital integrating circuit 5 and the feedback correcting circuit 6 of FIG. 3, this embodiment is provided with a digital integrating circuit 8 with correction having functions of the above circuits. The logic of the digital integration circuit 8 with correction is found by transforming the equation as described below. That is, the equation (2) is transformed as follows.

$$(1-z^{-1})Vc(z)=[X(z)-\{(1+z^{-1})Y4(z+(1-z^{-1})Y4(z)\}/2] \quad (6)$$

Here, since $Y4(z)=\{1+1/(1-z^{-1})\}Y1(z)$, the equation (6) can be written as $$(1-z^{-1})Vc(z)=[X(z)-\{(1+z^{-1})/2\cdot 1/(1-z^{-1})+3/2\}\cdot Y1(z)] \quad (7)$$

Assuming $Y3(z)=\{1/(1-z^{-1})\}Y1(z)$, the equation (7) can be expressed as $$(1-z^{-1})Vc(z)=[X(z)-\{(1+z^{-1})/2\cdot Y3(z)+3/2\cdot Y1(z)\}] \quad (8)$$

The logic of the digital integrating circuit 8 with correction is determined in compliance with the equation (8).

As shown in FIG. 7, the digital integrating circuit 8 with correction is constituted by a tripling circuit 8a, a ½ circuit 8b, an adder circuit 8c, and data latch circuits 8d and 8e. This constitution is smaller in circuit scale than the constitution of FIG. 3, since the number of adder circuits is small. As will be obvious from FIG. 8, furthermore, the output current Iq of the local D/A converter circuit 2 does not undergo a change at the timing φ1 of the comparing operation with respect to the voltage comparator in the quantizing circuit 4. Therefore, the probability of generating power source noise during the voltage comparing operation becomes considerably smaller than that of the constitution of FIG. 3, and the operation is more stably carried out.

Figure 9:
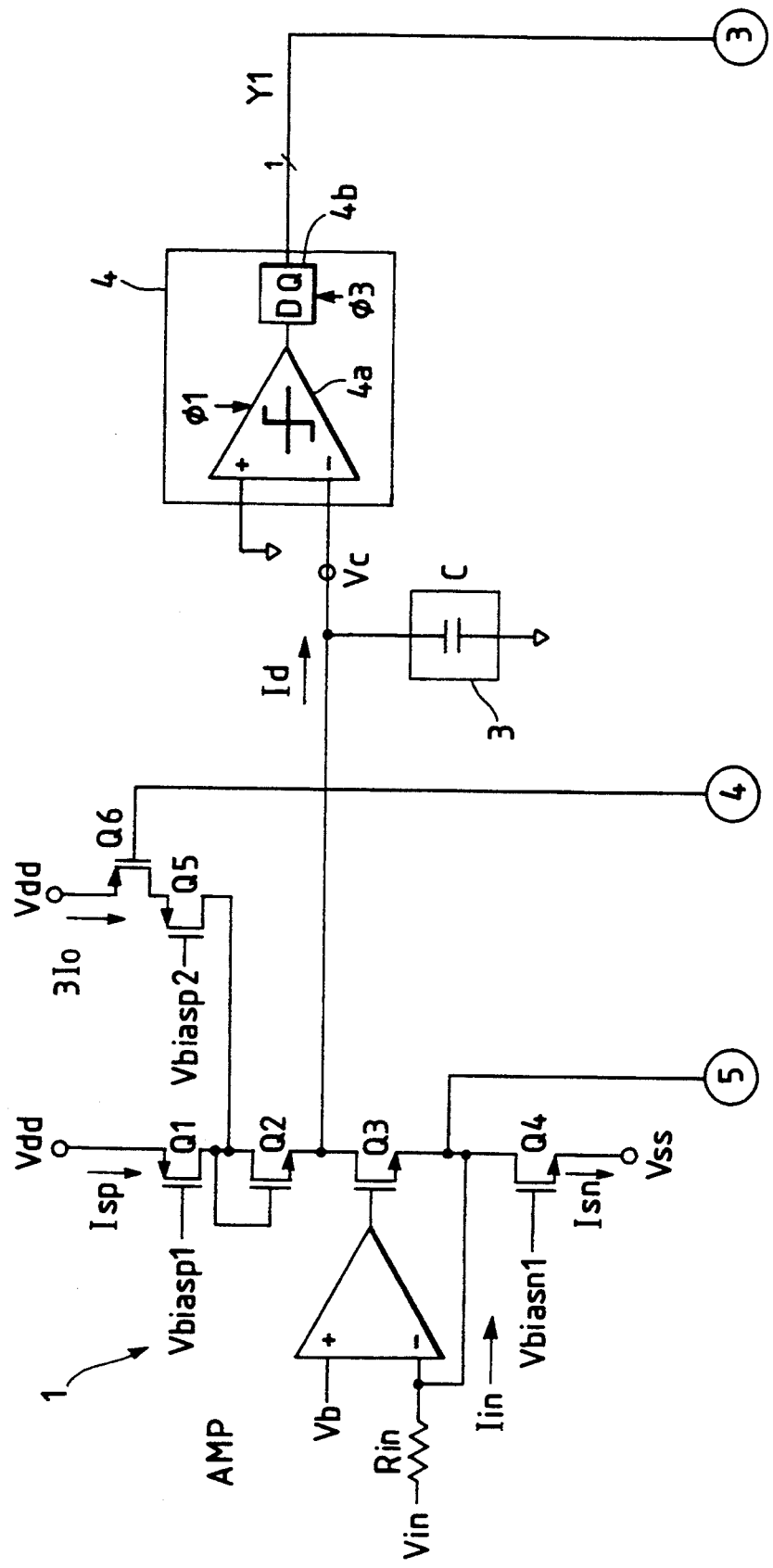
FIG. 9 is a circuit diagram which shows the constitution of FIG. 7 in further detail together with FIG. 10.
Figure 10:
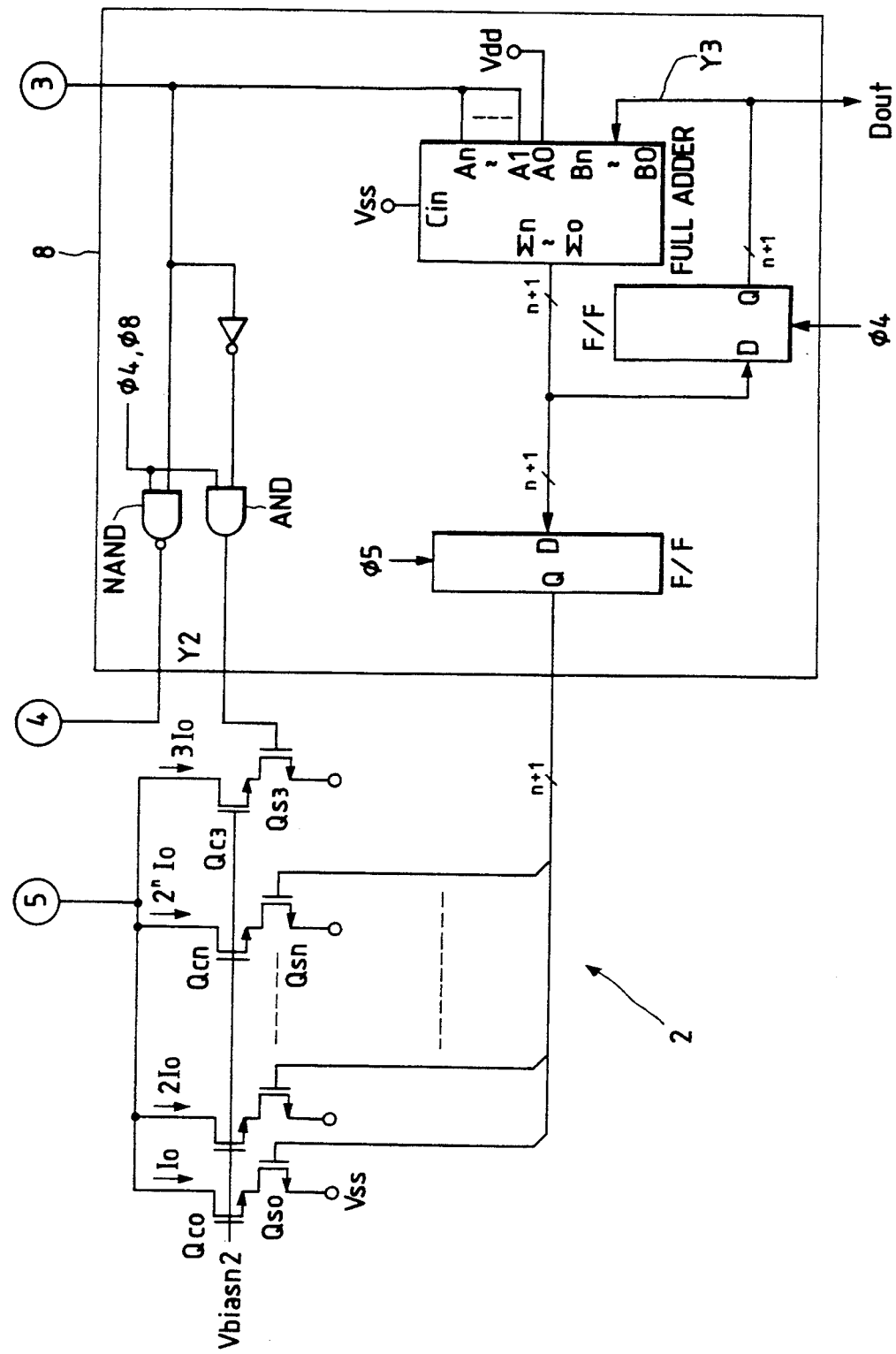
FIG. 10 is a circuit diagram which shows the constitution of FIG. 7 in further detail together with FIG. 9.

FIGS. 9 and 10 are circuit diagrams illustrating the constitution of FIG. 7 in further detail. The circuits shown in FIGS. 9 and 10 are connected to each other at corresponding portions designated by ③, ④ and ⑤.

The voltage-current converting circuit 1 shown in FIG. 10 has a current path constituted by p-channel MOSFETs Q5 and Q6 that are connected in series in addition to the constitution of FIG 5. The MOSFET Q5 has the drain thereof connected to the drain of the MOSFET Q2 and has the 9ate electrode that is biased by the voltage Vbiasp2. The MOSFET Q6 has the source thereof connected to a power source potential Vdd and permits the current 3IO to flow when it is turned on by the signal Y2 that is fed to the gate thereof. According to FIG. 10, the local D/A converting circuit 2 is constituted by n-channel MOSFETs Qc0 to Qcn, in which constant courrents IO, 2IO, ..., $2^n$IO, 3IO flow when the gate electrodes thereof are biased by the voltage Vbiasn2, and n-channel MOSFETs Qs0 to Qsn and Qs3 that are arranged between ground potential Vss and the drain electrodes of the MOSFETs Qc0 to Qcn and Qc3. The drain electrodes of the MOSFETs Qc0 to Qcn are commonly connected to the source electrode of the MOSFET Q3. Upon receiving a signal of n+1 bits outputted from the digital integration circuit 8 with correction through the gate electrodes thereof, the MOSFETs Qs0 to Qsn are controlled for the switching and permit binary load constant currents to flow depending upon the digital value of the above signal. Upon receiving the signal Y2 outputted from the digital integrating circuit 8 with correction through the gate electrode thereof, the MOSFET Qs3 is controlled for the switching and permits the current 3IO to flow when it is turned on.

In the digital integrating circuit 8 with correction shown in FIG. 10, the signal Y2 consists of two bits and is formed by a NAND gate NAND that receives two inputs, i.e., receives an output from the quantizing circuit 4 and a control signal φ4, and an AND gate AND that receives two inputs, i.e., receives an inverted signal of a signal outputted from the quantizing circuit 4 and the control signal φ4. In FIG. 10, the full adder circuit (Full Adder) corresponds to the adder circuit 8c of FIG. 7. The latch circuits 8e and 8d are of the parallel-in/parallel-out form of n+1 bits.

Figure 11:
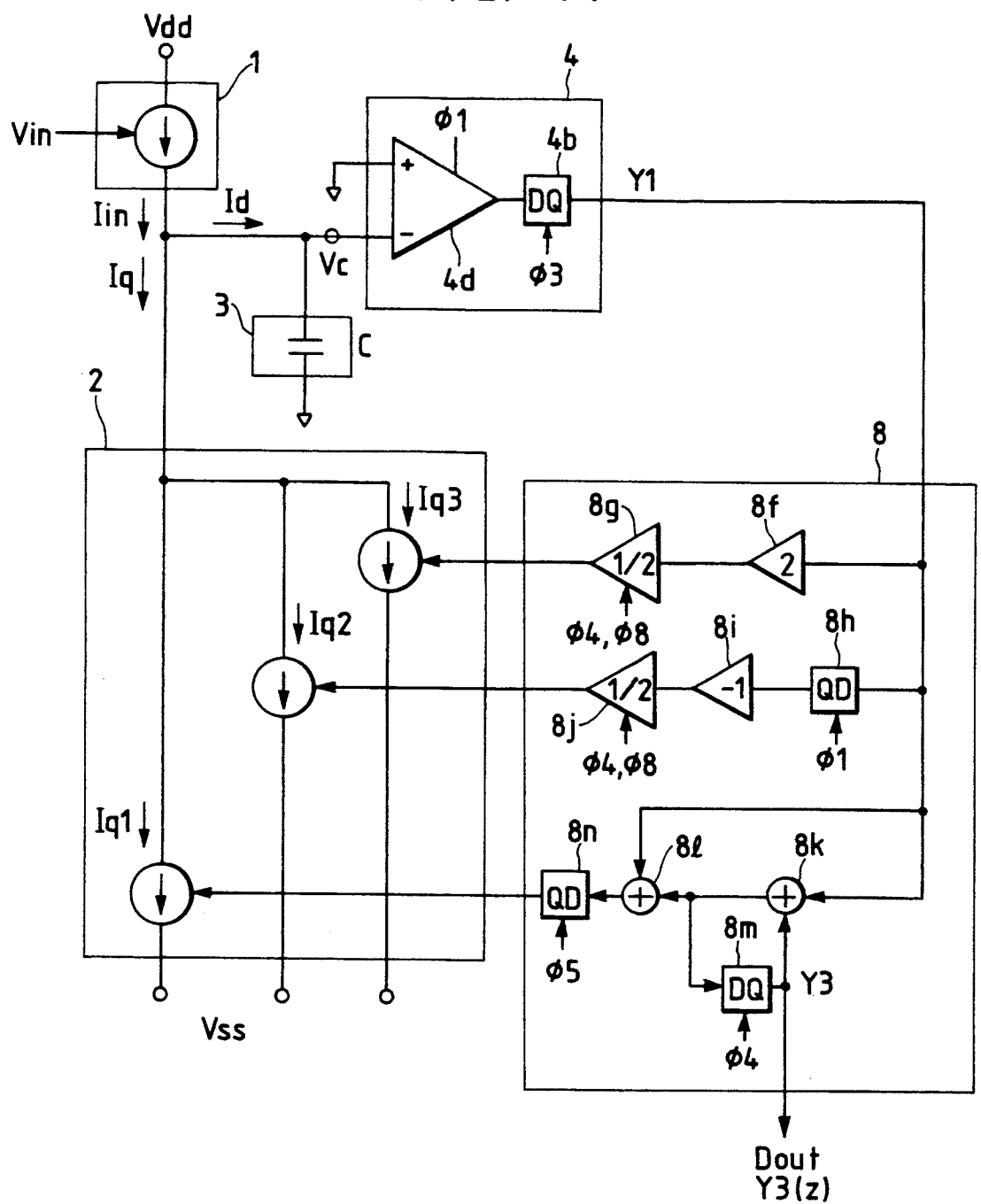
FIG. 11 is a block diagram of the interpolation type over-sampling A/D converter of a further embodiment according to the present invention.

FIG. 11 shows the interpolation-type over-sampling A/D converter according to a further embodiment of the present invention. This embodiment is provided with a digital integrating circuit 8 with correction which is different from that of FIG. 7. The logic of this digital integrating circuit 8 with correction is found by transforming the equation as described below. That is, in the equation (6).

$$Y4(z) = \{1 + 1/(1 - z^{-1})\}Y1(z)$$
$$= \{(2 - z^{-1})/(1 - z^{-1})\}Y1(z)$$

This is substituted in the equation (6) to obtain the following equation $$(1-z^{-1})Vc(z)=[X(z)-\{(1+z^{-1})Y4(z)/2 +2Y1(z)/2-z^{-1}Y1(z)/2\}] \quad (9)$$

The logic of the digital integrating circuit 8 with correction shown in FIG. 11 is determined in compliance with the equation (9). The digital integrating circuit 8 with correction is constituted by a doubling circuit 8f, a ½ circuit 8g, a latch circuit 8h, a −1 circuit 8i, a ½ circuit 8j, adder circuits 8k and 8l, and latch circuits 8m and 8n.

Figure 15:
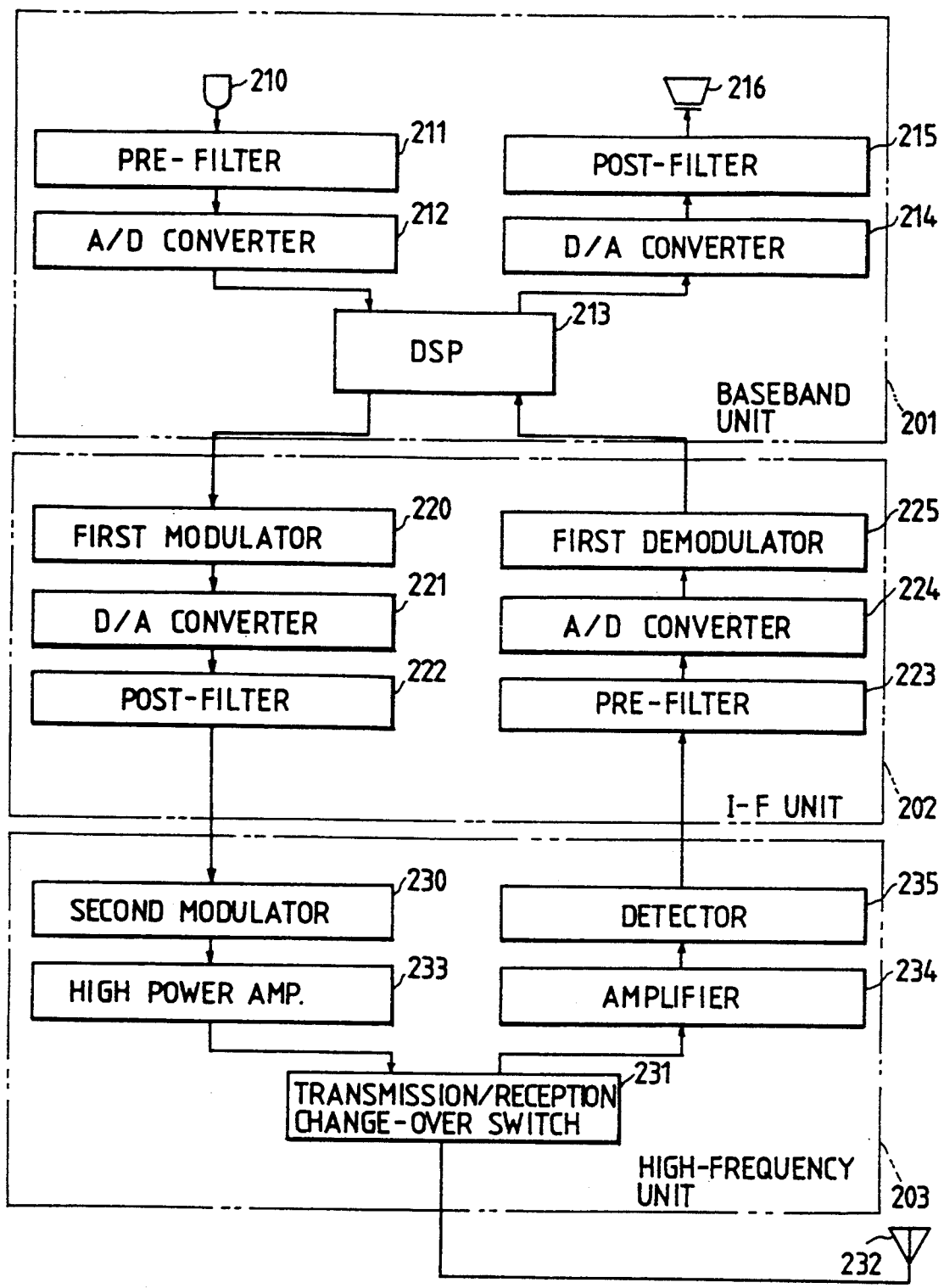
FIG. 15 is a block diagram of a portable communication terminal on which an A/D converter according to the present invention is mounted.

FIG. 15 illustrates an example of portable communication terminal equipment on which an A/D converter according to the present invention is mounted. The portable communication terminal equipment is constituted by a baseband unit 201, an intermediate-frequency unit 202, and a high-frequency unit 203.

The baseband unit 201 is constituted by a pre-filter 211 which suppresses high-pass noise components contained in the transmission analog voice signals inputted through a microphone 210, an A/D converter 212 of the present invention that converts an output of the pre-filter 211 into a digital signal, a digital-analog processor (hereinafter often referred to as DSP) 213 which band-compresses an output of the A/D converter 212 relying upon the digital signal processing and expands the band-compressed reception digital voice signal to the original band contrary to the above, a D/A converter 214 which converts the output that is band-expanded by 213 into an analog voice signal, a post filter 215 which suppresses high-pass components contained in the output of the filter 215 and amplifies the output, and a speaker 216 which is driven by the output of the post-filter 215.

The intermediate-frequency unit 202 is constituted by a first modulator 220 which subjects the signals outputted from the DSP 213 to a modulation adapted to radio transmission, such as Gaussian minimum shift keying (GMSK) modulation or π/4-shift QPSK modulation, a D/A converter 221 which converts the output of the first modulator 220 into an analog signal, a post-filter 222 which suppresses high-pass components included in the output of the D/A converter 221, a pre-filter 223 which suppresses wide-band noise components included in the reception modulated signals contrary to that mentioned above, the A/D converter 224 of the present invention which converts the output of the pre-filter 223 into a digital signal, and a first demodulator 225 which demodulates the original fundamental signal component from the output of the A/D converter 224.

The high-frequency unit 203 is constituted by a second modulator 230 which modulates signals outputted from the post-filter 222 with radio-frequency carrier signals of from about 800 MHz to about 2 GHz, a high-power amplifier 233 which amplifies the output of the modulator 230 to a predetermined transmission power and excites an antenna 232 via a transmission/reception change-over switch 231, an amplifier 234 which amplifies the signals received via the antenna 232 and the switch 231, and a detector 235 which detects desired signals from the outputs of the amplifier 234. Here, though not diagramed, provision is made of a keypad, a dialing signal generator, a calling signal generator, a control microcomputer, a clock signal generator, a power source circuit using a battery, etc.

The A/D converters 212 and 224 included in the portable communication terminal equipment are the over-sampling A/D converters of the type of current integration as described above, and are best suited for being powered by a battery since they consume small amounts of electric power and operate on a low power source voltage yet maintaining a high conversion precision. Moreover, even in the case of a single-chip analog-digital mixed large-scale semiconductor integrated circuit in which the baseband unit 201 and the intermediate-frequency unit 202 are provided separately or integrally together, the conversion characteristics of the A/D converters 212 and 224 deteriorate little as a result of digital noise from a logic circuit such as DSP 213 and has a high reliability.

In accordance with the foregoing description, the invention, accomplished by the present inventors, was specifically described by way of the exemplified embodiments. It should, however, be noted that the invention is in no way to be construed as being limited thereto but that it can be modified in a variety of ways without departing from the gist and scope of the invention. Though the foregoing embodiments have dealt with the interpolation-type over-sampling A/D converter employing a capacitance element as an analog integrating circuit, the present invention is not necessarily limited thereto but however, can be further adapted to the interpolation-type over-sampling A/D converter employing an analog integrating circuit of the type in which the resistance element and the capacitance element are connected in series and to the $\Delta\Sigma$-type over-sampling A/D converter as well. The present invention can be extensively adapted to at least the A/D converters of the over-sampling type which do not use a sampling switch.

Briefly described below are the effects obtained by representative aspects ones of the invention disclosed in this application.

The analog integrating circuit is constituted by passive elements that are connected to DC potential points without the need of using an operational amplifying circuit thereby suppressing the change in the amplitude of integration operation. This makes it possible to operate the over-sampling A/D converter on a low power source voltage and to reduce the consumption of electric power.

The analog integrating circuit constituted by passive elements connected to the DC potential points is not of the virtually grounded type which in principle is most apt to receive digital noise from the logic circuit but is of the grounded type, which makes it possible to realize an A/D converter having operation characteristics that are stable against fluctuations in the power source voltage or digital noise. This makes it possible to avoid the deterioration of characteristics resulting from noise interference which conventional virtually grounded-type integration circuits employing an operational amplifier have undergone. It is further possible to widen the band of conversion signals, though it has been difficult by the limitation of the improvement of the operation speed of the operational amplifier circuit even if the consumption current is increased.

In the current drive-type A/D converter, a plural-bit current switching circuit is employed for the local D/A converting circuit, in order to decrease a differential current between the input signal current and the feedback current signal, to stabilize the operation of the constant-current source MOS transistors that constitute the input voltage-current converting circuit and the local D/A converting circuit, thereby to realize the A/D converter that operates on a low power source voltage and consumes electric power in small amounts.

Moreover, since no sampling switch is required unlike the prior art, the characteristics are not deteriorated by the switching noise. Furthermore, since no circuit is required for forming sampling timings, the circuit constitution of the current drive-type A/D converter can be simplified.

What is claimed is:

1. An analog/digital converter comprising:
   an analog integrating circuit having a terminal supplied with a first current signal corresponding to an analog input signal at an input of said converter, wherein said analog integrating circuit includes a capacitance element having a first end connected to said terminal of said analog integrating circuit and having a second end connected to a predetermined potential, said analog integrating circuit providing an output potential at said terminal indicative of a voltage across said first and second ends of said capacitance element;
   a quantizing circuit including a voltage comparing circuit which compares said output potential at said terminal of said analog integrating circuit with a predetermined reference potential and which operates in accordance with timings of operating cycles, wherein said analog input signal is continuously sampled during timings of each of said operating cycles;
   a digital integrating circuit which provides a digital output signal based on an output of said quantizing circuit; and
   a feedback circuit which operates in accordance with said operating cycles, each operating cycle being composed of a first half cycle and a second half cycle, which outputs to said terminal of said analog integrating circuit a first signal corresponding to a digital output signal of a preceding operating cycle during said first half cycle of a currently operating cycle, and which outputs to said terminal of said analog integrating circuit, during said second half cycle of said currently operating cycle, a second signal corresponding to a digital output signal of said currently operating cycle and determined in said first half cycle thereof, wherein an average value of said first and second signals of said currently operating cycle is equal to a value of a second current signal corresponding to said digital output signal of said currently operating cycle, and wherein said analog integrating circuit integrates a differential current based on a difference between said first current signal and said second current signal.

2. An analog/digital converter according to claim 1, further comprising a voltage-current converting circuit for converting said analog input signal into said first current signal and transmitting said first current signal to said terminal of said analog integrating circuit.

3. An analog/digital converter according to claim 2, wherein said first signal of said currently operating cycle has an average value of said digital output signal of said preceding operating cycle.

4. An analog/digital converter according to claim 3, wherein said feedback circuit includes a local D/A converter circuit that generates said first and second signals and a circuit that generates an input digital signal in accordance with said digital output signal to said local D/A converter circuit.

5. An analog/digital converter according to claim 4, wherein said analog integrating circuit further includes a resistance element connected between said first end of said capacitance element and said terminal.

6. An analog/digital converter according to claim 5, wherein said input digital signal applied to said local D/A converting circuit consists of a plurality of bits.

7. An analog/digital converter according to claim 6, wherein said analog/digital converter is formed on a semiconductor substrate.

8. An analog/digital converter comprising:
an analog integrating circuit having a terminal supplied with a first current signal, corresponding to an analog input signal at an input of said converter;
a quantizing circuit including a voltage comparing circuit which compares an output potential, attained at said terminal of said analog integrating circuit, with a predetermined reference potential, said output potential being indicative of a magnitude of said first current signal, and said voltage comparing circuit operating in accordance with timings of operating cycles, wherein said analog input signal is continuously sampled during timings of each of said operating cycles;
a digital integrating circuit which provides a digital output signal based on a potential from an output of said quantizing circuit;

a feedback circuit which operates in accordance with said operating cycles, each operating cycle being composed of a first half cycle and a second half cycle, which outputs to said terminal of said analog integrating circuit a first signal corresponding to a digital output signal of a preceding operating cycle during said first half cycle of a currently operating cycle, and which outputs to said terminal of said analog integrating circuit, during said second half cycle of said currently operating cycle, a second signal corresponding to a digital output signal of said currently operating cycle and determined in said first half cycle of said current operating cycle, wherein an average value of said first and second signals of said current operating cycle is equal to a value of a second current signal corresponding to said digital output signal of said currently operating cycle; and
a voltage-current converting circuit for converting said analog input signal into said first current signal and transmitting said first current signal to said terminal of said analog integrating circuit, wherein said analog integrating circuit integrates a differential current based on a difference between said first current signal and said second current signal.

9. An analog/digital converter according to claim 8, wherein said first signal of said currently operating cycle has an average value of said digital output signal of said preceding operating cycle.

10. An analog/digital converter according to claim 9, wherein said feedback circuit includes a local D/A converter circuit that generates said first and second signals and a circuit that generates an input digital signal in accordance with said digital output signal to said local D/A converter circuit.

11. An analog/digital converter according to claim 10, wherein said analog integrating circuit includes a capacitance element of which a first end thereof is connected to a common connection of said voltage-current converting circuit and said local D/A converting circuit and of which a second end thereof is connected to receive a predetermined potential.

12. An analog/digital converter according to claim 11, wherein said analog integrating circuit further includes a resistance element connected between said first end of said capacitance element and said common connection.

13. An analog/digital converter according to claim 12, wherein said input digital signal applied to said local D/A converting circuit consists of a plurality of bits.

14. An analog/digital converter according to claim 13, wherein said analog/digital converter is formed on a semiconductor substrate.

* * * * *